United States Patent
O'Toole et al.

(10) Patent No.: US 11,264,271 B2
(45) Date of Patent: Mar. 1, 2022

(54) SEMICONDUCTOR FABRICATION METHOD FOR PRODUCING NANO-SCALED ELECTRICALLY CONDUCTIVE LINES

(71) Applicant: IMEC VZW, Leuven (BE)

(72) Inventors: Martin O'Toole, Overijse (BE); Zsolt Tokei, Leuven (BE); Christopher Wilson, Tervuren (BE); Stefan Decoster, Bertem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/081,337

(22) Filed: Oct. 27, 2020

(65) Prior Publication Data
US 2021/0193512 A1     Jun. 24, 2021

(30) Foreign Application Priority Data
Dec. 19, 2019 (EP) .................................. 19217971

(51) Int. Cl.
*H01L 21/768* (2006.01)
*H01L 21/033* (2006.01)
*H01L 23/538* (2006.01)

(52) U.S. Cl.
CPC .... *H01L 21/76816* (2013.01); *H01L 21/0337* (2013.01); *H01L 21/76877* (2013.01); *H01L 23/5384* (2013.01); *H01L 23/5386* (2013.01)

(58) Field of Classification Search
CPC .......... H01L 21/76816; H01L 21/0337; H01L 21/76877; H01L 23/5386; H01L 21/31144; H01L 21/0332; H01L 23/528; H01L 23/5283; H01L 21/76897; H01L 21/76802
See application file for complete search history.

(56) References Cited

U.S. PATENT DOCUMENTS

| | | | |
|---|---|---|---|
| 9,786,545 B1 | 10/2017 | Bouche et al. | |
| 9,818,641 B1 | 11/2017 | Bouche et al. | |
| 9,953,834 B1 | 4/2018 | Sun et al. | |
| 9,966,338 B1 * | 5/2018 | Zhang | H01L 21/76816 |

(Continued)

OTHER PUBLICATIONS

Extended European Search Report from the European Patent Office, for European Patent Application No. EP19217971.1, dated Aug. 3, 2020, pp. 1-5.

(Continued)

*Primary Examiner* — Bac H Au
(74) *Attorney, Agent, or Firm* — McDonnell Boehnen Hulbert & Berghoff LLP

(57) ABSTRACT

A method is provided for producing electrically conductive lines (23a, 23b), wherein spacers are deposited on a sacrificial structure present on a stack of layers, including a hardmask layer on top of a dielectric layer into which the lines are to be embedded, and an intermediate layer on top of the hardmask layer. A self-aligned litho-etch step is then performed to create an opening in the intermediate layer, the opening being self-aligned to the space between two adjacent sidewalls of the sacrificial structure. This self-aligned step precedes the deposition of spacers on the sacrificial structure, so that spacers are also formed on the transverse sidewalls of the opening, i.e. perpendicular to the spacers on the walls of the sacrificial structure. A blocking material is provided in the area of the bottom of the opening that is surrounded on all sides by spacers, thereby creating a block with a reduced size.

10 Claims, 10 Drawing Sheets

(56) References Cited

U.S. PATENT DOCUMENTS

| | | | | |
|---|---|---|---|---|
| 10,192,780 B1* | 1/2019 | Wang | ................ | H01L 21/76816 |
| 10,199,270 B2* | 2/2019 | Bombardier | ............ | H01L 22/32 |
| 10,249,496 B2* | 4/2019 | Shu | ..................... | H01L 23/5256 |
| 10,319,626 B1* | 6/2019 | Tang | .................. | H01L 21/0338 |
| 10,395,926 B1* | 8/2019 | Tang | .................. | H01L 21/31144 |
| 10,446,395 B1* | 10/2019 | Shu | ..................... | H01L 21/0332 |
| 10,490,447 B1* | 11/2019 | Cheng | ................. | H01L 21/0337 |
| 10,692,812 B2* | 6/2020 | Srivastava | ........ | H01L 21/76892 |
| 10,755,969 B2* | 8/2020 | Chu | .................. | H01L 21/76831 |
| 10,784,195 B2* | 9/2020 | Shu | .................. | H01L 21/76877 |
| 11,061,315 B2* | 7/2021 | Zeng | .................. | H01L 21/0338 |
| 2017/0338116 A1 | 11/2017 | deVilliers et al. | | |
| 2019/0189444 A1 | 6/2019 | Sun et al. | | |
| 2019/0318928 A1* | 10/2019 | Mignot | ............... | H01L 21/3086 |
| 2020/0111668 A1* | 4/2020 | O'Toole | ............ | H01L 21/31111 |
| 2020/0111676 A1* | 4/2020 | Chen | ................ | H01L 21/31144 |
| 2020/0111677 A1* | 4/2020 | Srivastava | ........ | H01L 21/76816 |
| 2020/0118872 A1* | 4/2020 | Chen | ................ | H01L 21/76802 |
| 2021/0090889 A1* | 3/2021 | Cheng | ................ | H01L 21/3115 |

OTHER PUBLICATIONS

Lee, Jae Uk, Soo Han Choi, Yasser Sherazi, and Ryan Ryoung Han Kim. "SAQP spacer merge and EUV self-aligned block decomposition at 28nm metal pitch on imec 7nm node." In Design-Process-Technology Co-optimization for Manufacturability XIII, vol. 10962, p. 109620N. International Society for Optics and Photonics, 2019.

* cited by examiner

A-A

SEMICONDUCTOR FABRICATION METHOD FOR PRODUCING NANO-SCALED ELECTRICALLY CONDUCTIVE LINES

CROSS-REFERENCE

This application claims priority to European Patent Application No. 19217971.1, filed Dec. 19, 2019, which is incorporated by reference in its entirety.

FIELD OF THE DISCLOSURE

The present disclosure is related to semiconductor processing, in particular to the fabrication of a dense pattern of electrically conductive lines, as applied in the back end of line part of a chip manufacturing process.

BACKGROUND OF THE DISCLOSURE

The back end of line (BEOL) refers to the interconnect structure of a semiconductor chip and to the process of fabricating this structure. The BEOL structure comprises multiple levels of electrical conductors, connected together through interconnect vias. The continuing trend in terms of scale reduction has led to the application of specific techniques for the production of a dense array of nano-scaled metal lines in the BEOL. In particular, the use of self-aligned patterning techniques has been introduced. One challenge is the scaling of the tip-to-tip space between two colinear metal lines, which can be typically produced using a self-aligned block approach. However, whereas the pitch between parallel metal lines has been reduced to about 16 nm using dual and quadruple self-aligned patterning techniques, there are currently no reliable techniques for reducing the tip-to-tip spacing to values lower than about 18 nm. The tip-to-tip spacing can be therefore disproportionately high with respect to the linewidths and pitch, and a reduction of this spacing is desirable in terms of obtaining a more efficient utilisation of the available chip surface.

SUMMARY OF THE DISCLOSURE

The disclosure aims to provide a solution to the problem described in the previous paragraph. This aim can be achieved by the method according to the appended claims.

The disclosure relates to a method for producing electrically conductive lines such as lines in the BEOL, wherein spacers can be deposited on a sacrificial structure present on a stack of layers, comprising a hardmask layer on top of a dielectric layer into which the lines are to be embedded, and an intermediate layer on top of the hardmask layer. The sacrificial structure may be an array of parallel mandrel lines as known from self-aligned multiple patterning techniques. A self-aligned litho-etch step can then performed to create an opening in the intermediate layer, the opening being self-aligned to the space between two adjacent sidewalls of the sacrificial structure. The opening can be formed prior to the deposition of spacers on the sacrificial structure, so that spacers are also formed on the transverse sidewalls of the opening, i.e. perpendicular to the spacers on the walls of the sacrificial structure. A blocking material can be provided in the area of the bottom of the opening that is surrounded on all sides by spacers, thereby creating a block with a reduced size, compared to prior art techniques. The transfer of the spacer and block pattern to the hardmask layer allows creation of colinear conductive lines with a reduced tip-to-tip spacing compared to conventional methods.

The disclosure also relates to a method for producing electrically conductive lines on a planar substrate, embedded in a dielectric material, wherein at least two colinear lines can be separated by a dielectric gap between the tips of said two lines, the method comprising the following steps:

producing a mask layer on a layer of said dielectric material formed on the substrate;

producing an intermediate layer on top of and in contact with the mask layer;

producing a sacrificial structure on the intermediate layer, the sacrificial structure comprising at least two parallel and mutually facing sidewalls of the structure with an elongate open area between said sidewalls, the open area extending in the X-direction of an orthogonal X-Y axis system in a plane parallel to the substrate;

by a lithography and etch process, producing an essentially rectangular opening in the intermediate layer, thereby locally exposing the mask layer, wherein
the size of the opening in the Y-direction is self-aligned relative to the two parallel sidewalls, and
the size of the opening in the X-direction is defined by a mask pattern applied in the lithography and etch process, depositing a layer of spacer material conformally on the sacrificial structure and on the bottom and sidewalls of the opening;

etching back the spacer material so as to expose the top of the sacrificial structure, thereby creating:
Two high spacers extending in the X-direction on the two parallel sidewalls; and
Two low spacers extending in the Y-direction on the two sidewalls of the opening extending in said Y-direction, wherein the mask layer is exposed in an area of the bottom of the opening, said area being surrounded by the two low spacers and by the two high spacers;

removing the sacrificial structure selectively with respect to the spacers;

depositing a blocking material on the exposed area of the mask layer;

using the spacers and the blocking material as a mask for patterning the intermediate layer and the mask layer, thereby creating a patterned mask on the layer of dielectric material;

etching trenches in the layer of dielectric material, in accordance with the patterned mask;

filling the trenches with an electrically conductive material and planarizing said material, thereby obtaining two colinear conductive lines separated by a dielectric gap at the location of the blocking material.

According to an embodiment, the sacrificial structure may be an array of mutually parallel mandrel lines, and wherein the two parallel sidewalls of the sacrificial structure may be the mutually facing sidewalls of two adjacent mandrel lines.

According to an embodiment, the sidewalls of the opening in the intermediate layer, extending in the Y-direction may be slanted inward toward the middle of the opening, so that the width in the X-direction of the exposed area of the mask layer may be reduced compared to a case wherein said sidewalls of the opening are vertical.

The mask layer may be a titanium nitride layer and the intermediate layer may be a layer of silicon nitride.

According to various embodiments, the width of the dielectric gap in the X-direction may be lower than 18 nm, or lower than 10 nm or lower than 5 nm.

BRIEF DESCRIPTION OF THE DRAWINGS

FIG. 2 illustrates a mask layer 10 is deposited on the wafer, and patterned so that an opening 11 is formed in the mask layer.

FIG. 3a illustrates an etch process may then be applied which removes the SiN layer 3 selectively with respect to the mandrel lines 4 and the mask layer 10, after which the mask layer 10 may be stripped.

FIG. 3b illustrates, in the X-direction, the SiN layer 3 being etched so that it has vertical sidewalls 13a and 13b to thereby create an essentially rectangular opening with size D in this X-direction.

FIG. 4a illustrates, after the etch process, a layer 14 of the spacer material may be deposited conformally.

FIG. 4b illustrates the spacer material now also lines the sidewalls and bottom of the opening.

FIG. 5a illustrates the spacer material 14 may be etched back in the direction perpendicular to the wafer until the top of the mandrel lines 4 and the SiN layer 3 in between the mandrel lines 4 is exposed, thereby creating effective spacers 19 on the vertical sidewalls of the mandrel lines 4.

FIG. 5b illustrates that in the Y-direction, the TiN area 15 is located between two high spacers 19a and 19b (having the height of the mandrel lines), and in the X-direction the TiN area 15 is located between two low spacers (having the height of the SiN layer) 16a and 16b.

FIG. 6 illustrates that the mandrel lines 4 may then be removed selectively with respect to the spacers 19 and 16a, 16b, FIG. 7 illustrates a layer 20 of ruthenium may be deposited only on the TiN area 15.

FIG. 8 illustrates that etching of the TiN hardmask 2 may take place, using the spacers 19, 16a, 16b and the Ru-block 20 as a mask, followed by stripping the spacer material 19, the Ru block 20, and the SiN layer 3.

FIG. 9 illustrates the step of filling the trenches 21 with conductive material, generally metal.

FIGS. 10a to 10c illustrate how a slanted angle of the sidewalls of an opening produced during the method of the disclosure can further shrink the tip-to-tip spacing. FIG. 10a shows the sides 13a and 13b of the opening 12 etched in the SiN layer 3 may be slightly slanted inward toward the middle of the opening, as a consequence of an inwardly slanted orientation of the sidewalls of the opening 11 in the mask layer 10. FIGS. 10b and 10c illustrate that the deposition of the spacer material 14 and the spacer etch-back are performed as described above, also in the case of the slanted sides 13a and 13b, and that this slanted orientation further reduces the width of the exposed TiN area 15 in the X-direction.

DETAILED DESCRIPTION OF THE DISCLOSURE

Figure 1:
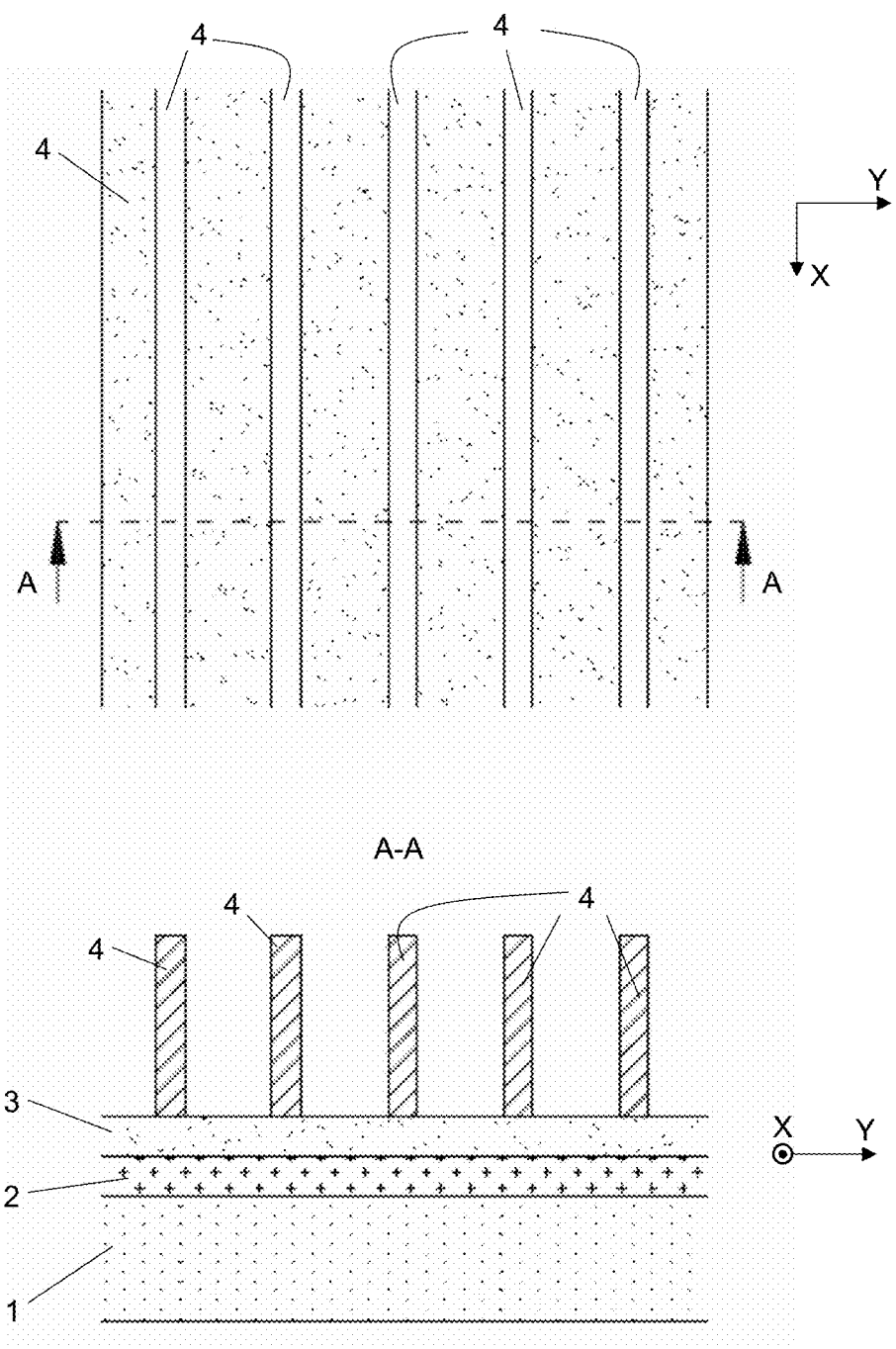
FIG. 1 shows a plane view and a section view of a portion of a substrate onto which the method of the disclosure may be applied.

The disclosure will be described with reference to the drawings, and with reference to specific materials for the layers and structures shown therein. These materials are stated by way of example, and do not form a limitation to the scope of the disclosure. A layer 1 of a dielectric material is shown in FIG. 1. This may be a layer of so-called inter-metal dielectric present on a semiconductor wafer (not shown) onto which a front end of line (FEOL) process has been performed, fabricating active devices such as transistors and diodes on the wafer. The IMD layer may be a layer of silicon dioxide. As well-known to the skilled person, the BEOL process consists of the consecutive deposition and patterning of IMD layers into which via openings and trenches are etched and subsequently filled with a conductive material, to thereby form a multi-level interconnect structure. The method of the disclosure may applicable to the formation of any one of these levels, in particular to the formation of a level comprising a dense array of nano-scaled parallel conductors.

A titanium nitride (TiN) hardmask layer 2 may be present on top of and in contact with the IMD layer 1. The hardmask 2 may be patterned by the method steps described hereafter, in order to form a pattern that can be transferred by etching into the IMD layer 1. On top of and in contact with the TiN layer 2 is a layer 3 of silicon nitride, hereafter referred to as the 'SiN' layer for conciseness, even though the chemical compound forming this layer is typically $Si_3N_4$. This layer 3 is referred to as the 'intermediate layer' in the appended claims. Both the TiN layer 2 and the SiN layer 3 may have thicknesses ranging between 5 nm and 30 nm. Suitable techniques for producing these TiN and SiN layers are chemical vapour deposition (CVD) and Atomic Layer Deposition (ALD). On the SiN layer 3, an array of parallel fin-shaped structures 4 may be present, referred to hereafter as mandrel lines 4, formed of amorphous silicon. The mandrel lines 4 extend in the X-direction of an orthogonal X-Y axis system in a plane parallel to the wafer surface. The mandrel lines 4 may be formed according to any known method for self-aligned multiple patterning, such as SADP (self-aligned double patterning) or SAQP (self-aligned quadruple patterning). The dimensions of the structure may be in the order of nanometres. For example, the width of the mandrel lines 4 may be about 8 nm. The mandrel lines 4 may be produced by a lithography and etch process in the case of SADP, and in the case of SAQP by depositing spacers on a set of initial wider mandrel lines and transferring the spacer pattern to an underlying layer to create the mandrel lines shown in FIG. 1. Process details as known from SADP and SAQP technologies may be applied.

As also known in the art, the mandrel structure serves as a support for the formation of spacers (second spacers in the case of SAQP) on the sides of the mandrel lines 4, followed by the removal of the mandrel material, thereby creating spacer lines at a reduced pitch compared to the mandrel lines. The spacers subsequently define the pattern that is transferred to the TiN hardmask 2 and ultimately to the IMD layer 1. However, in order to produce two conductive lines in the IMD layer 1 extending along the same linear direction and interrupted by a dielectric gap that isolates the tips of the lines from each other, a blocking material needs to be applied locally on the TiN mask 2. According to what is generally referred to as the 'self-aligned block' technology, this blocking material may be applied by a self-aligned etch process applied after the spacer deposition.

Figure 2:
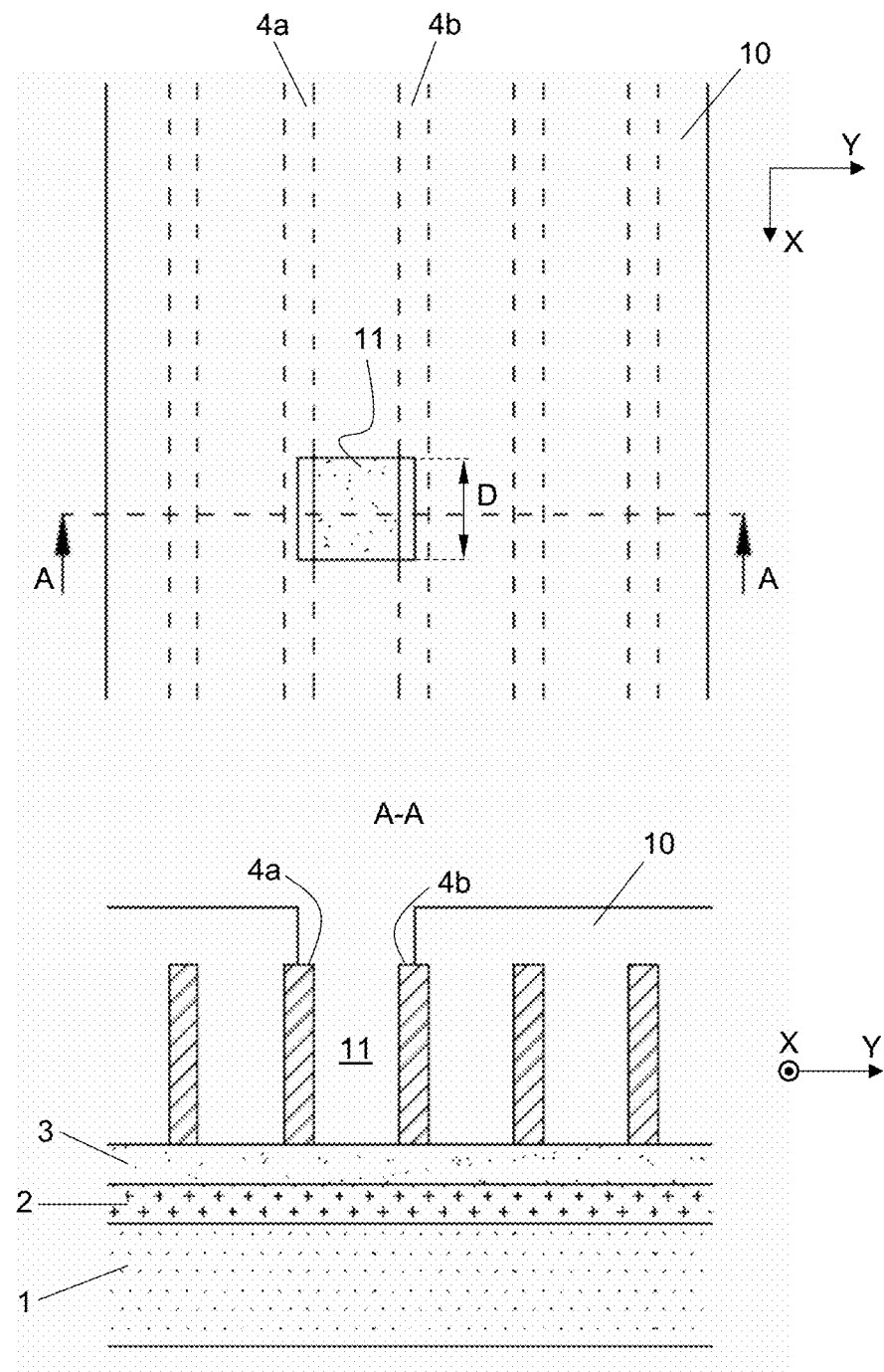
FIGS. 2, 3a, 3b, 4a, 4b, 5a, 5b, 6-9, 10a, 10b and 10c illustrate consecutive method steps applied to the substrate shown in FIG. 1, in accordance with an embodiment of the disclosure.

The present disclosure differs from the prior art methodology by performing a number of steps related to the self-aligned block, before the spacer deposition. The details are explained with reference to FIGS. 2 to 9. As shown in FIG. 2, a mask layer 10 is deposited on the wafer, and patterned so that an opening 11 is formed in the mask layer. The mask layer 10 may be obtained by a multilayer stack known as such in the art, and consisting of a spin-on-carbon layer, a spin-on glass layer, and a resist layer. The dimensions and position of the opening 11 are such that the opening overlaps the opposite edges of two adjacent mandrel lines 4a and 4b in the Y-direction, while extending over a given distance D in the X-direction. Only one opening 11 is shown in the example, but multiple openings may be present depending on the required pattern. One opening could overlap more than two adjacent mandrel lines 4.

Figure 3A:
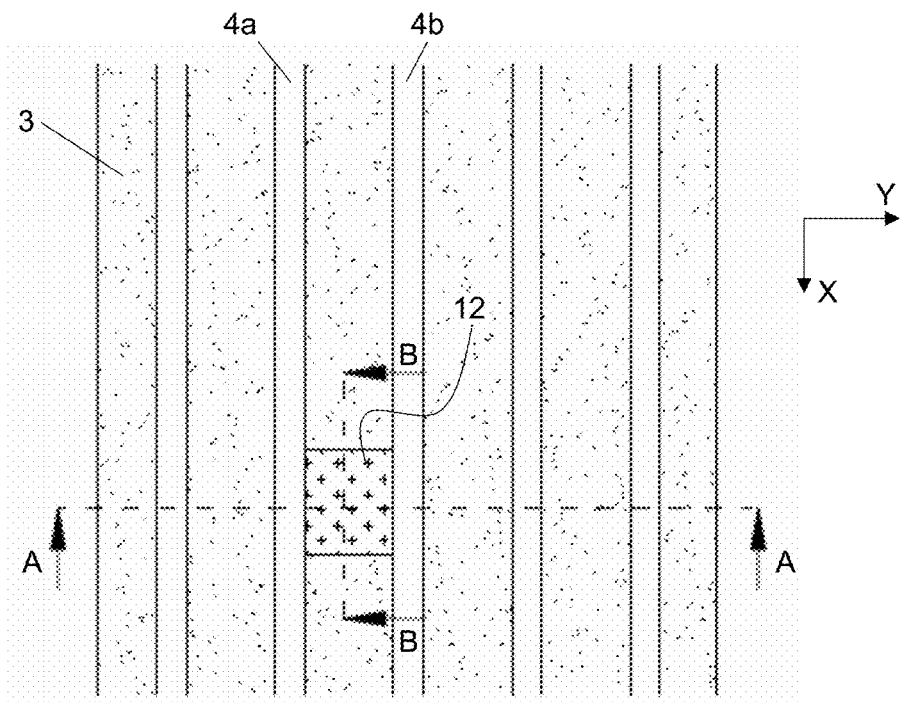
Figure 3A:
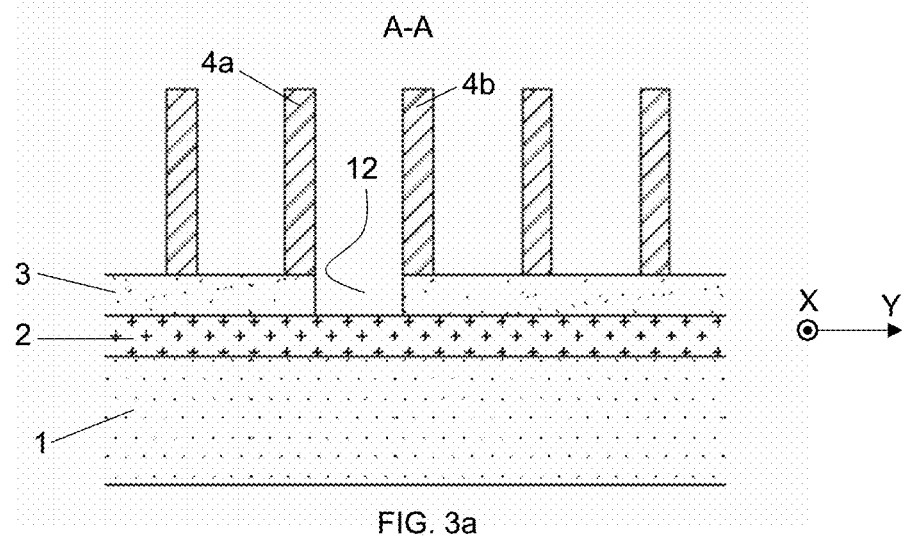

The overlap in the Y-direction means that the opening 11 may be over-dimensioned with respect to the spacing between the adjacent mandrel lines 4a and 4b. An etch process may then be applied which removes the SiN layer 3 selectively with respect to the mandrel lines 4 and the mask layer 10, after which the mask layer 10 may be stripped as shown in FIG. 3a. This may be a reactive ion etch process known per se in the art. Due to the over-dimensioned opening 11, the etch process may be self-aligned in the Y-direction, i.e. the opening 12 that is etched in the SiN layer 3 aligns to the sides of the mandrel lines 4a and 4b. In the X-direction, the SiN layer 3 may be etched so that it has vertical sidewalls 13a and 13b as shown in the detail in FIG. 3b, to thereby create an essentially rectangular opening with size D in this X-direction. This etch with perfectly vertical sidewalls may be achievable but it is not the standard case, as the sidewalls of the opening 11 in the mask layer 10 are usually slanted inward, and this slope may be transferred to the opening 12 in the SiN layer 3. This slanted angle may not however be disadvantageous for the present disclosure, as long as the slanting angle is not too pronounced, as will be explained later in this description. For the sake of explaining the main characteristics of the disclosure however, vertical sidewalls of the opening 12 are assumed.

Figure 4A:
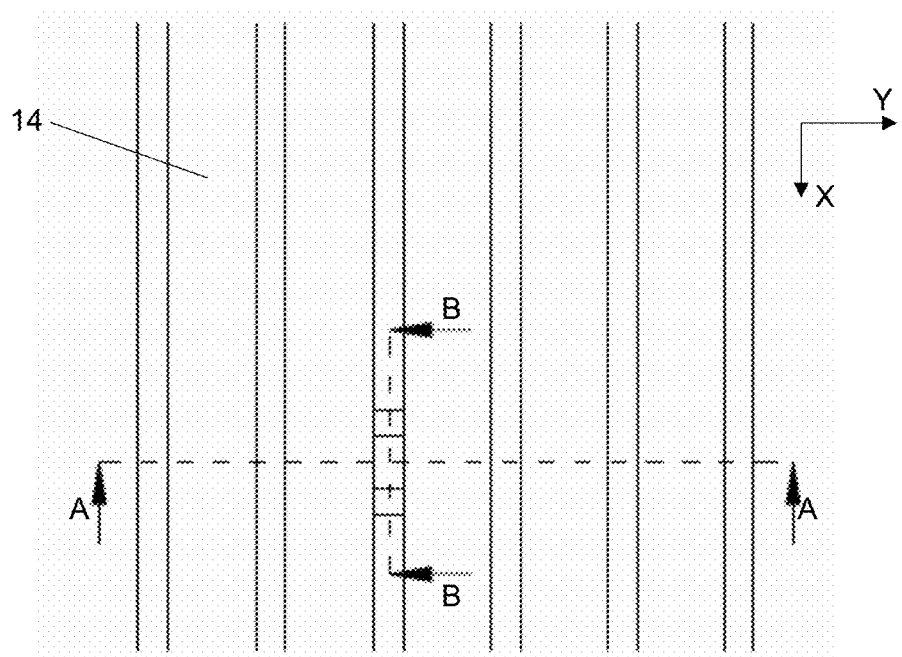
Figure 4A:
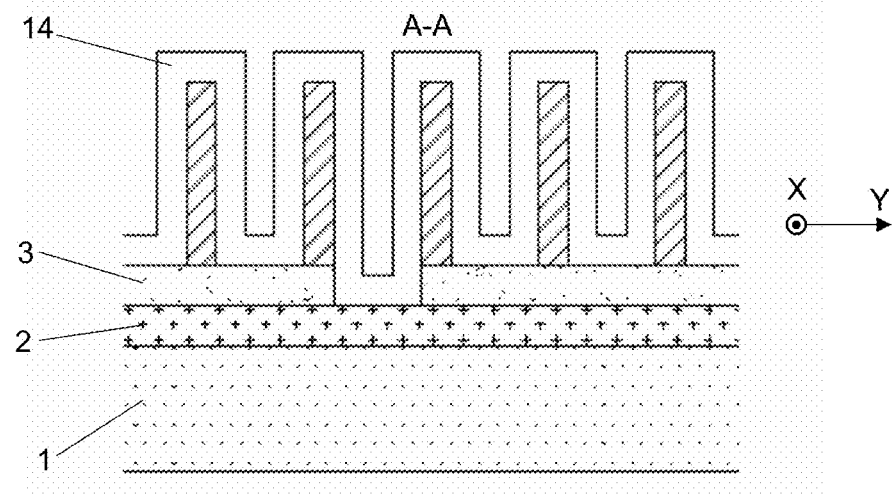
Figure 4B:
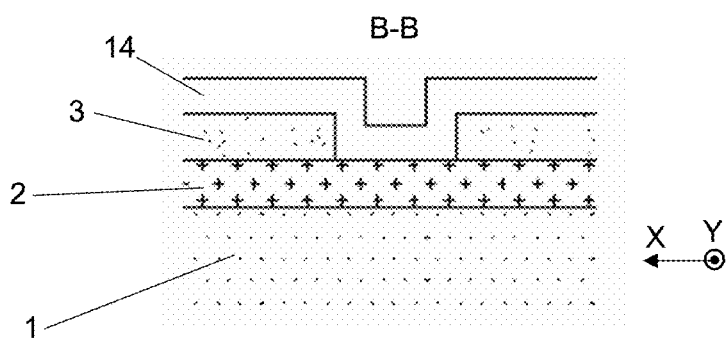

After this etch process, a layer 14 of the spacer material may be deposited conformally as shown in FIG. 4a. The spacer material may be silicon dioxide, deposited at a thickness configured so that the gap between two adjacent vertical spacer layers on the sidewalls of the mandrel lines is approximately the same in thickness as the mandrel lines. For example, if the mandrel lines are 8 nm wide and spaced apart about 24 nm, the spacer thickness may be about 8 nm as well. The process used for depositing the spacer material may be any process known in the art for this purpose, such as atomic layer deposition (ALD). In the opening 12, the spacer material now also lines the sidewalls and bottom of the opening, as shown in the detail section in FIG. 4b.

Figure 5A:
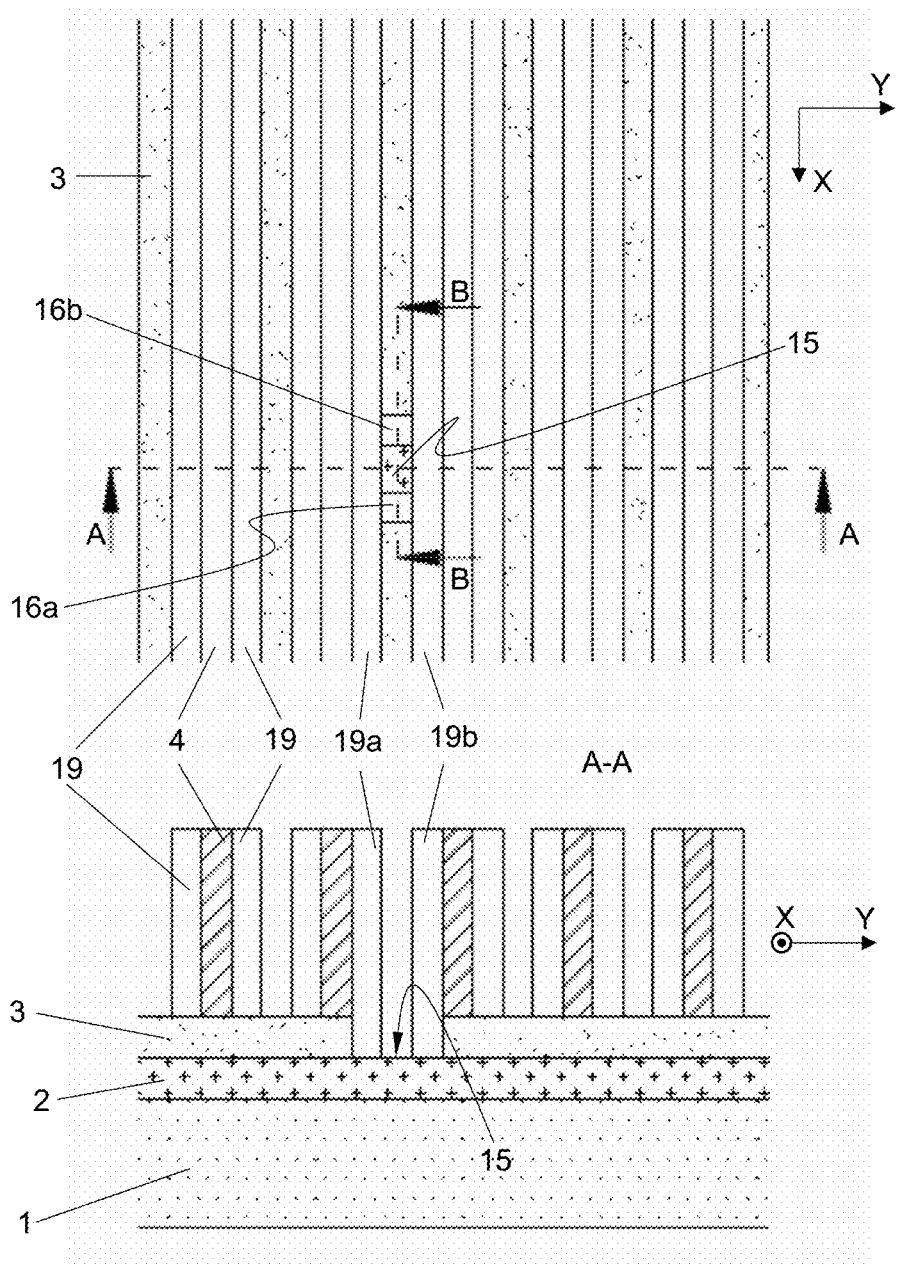
Figure 5B:
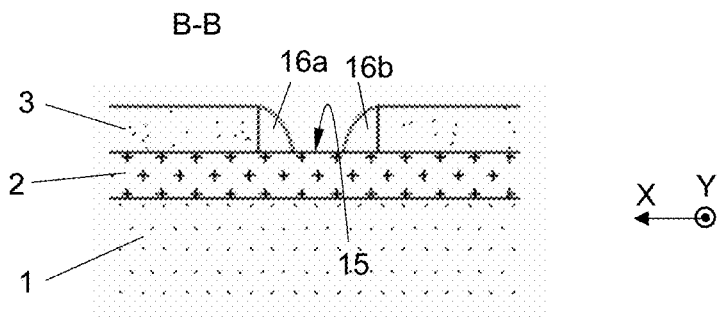

The spacer material 14 may be etched back in the direction perpendicular to the wafer as shown in FIG. 5a, until the top of the mandrel lines 4 and the SiN layer 3 in between the mandrel lines 4 is exposed, thereby creating effective spacers 19 on the vertical sidewalls of the mandrel lines 4. This may be realized by a plasma etch process as known per se in the art, that protects the vertical surfaces of the spacers while etching away the horizontal portions of the spacer material. The result is that a central area 15 of the TiN hardmask layer 2 becomes exposed in the centre of the bottom of the opening 12, surrounded on all sides by spacer material. FIG. 5a and the detail section in FIG. 5b illustrate that in the Y-direction, the TiN area 15 is located between two high spacers 19a and 19b (having the height of the mandrel lines), and in the X-direction the TiN area 15 is located between two low spacers (having the height of the SiN layer) 16a and 16b.

Figure 6:
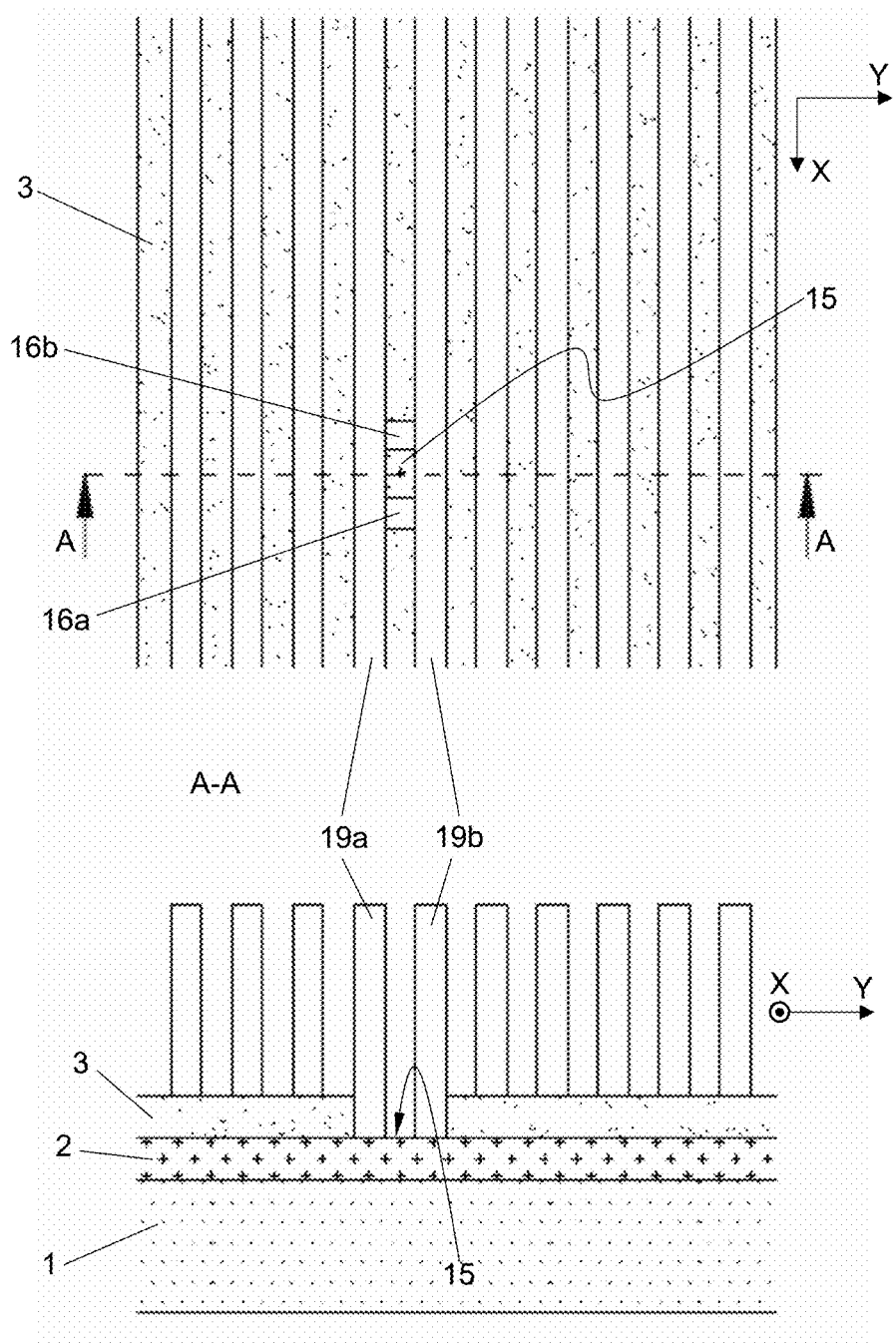
Figure 7:
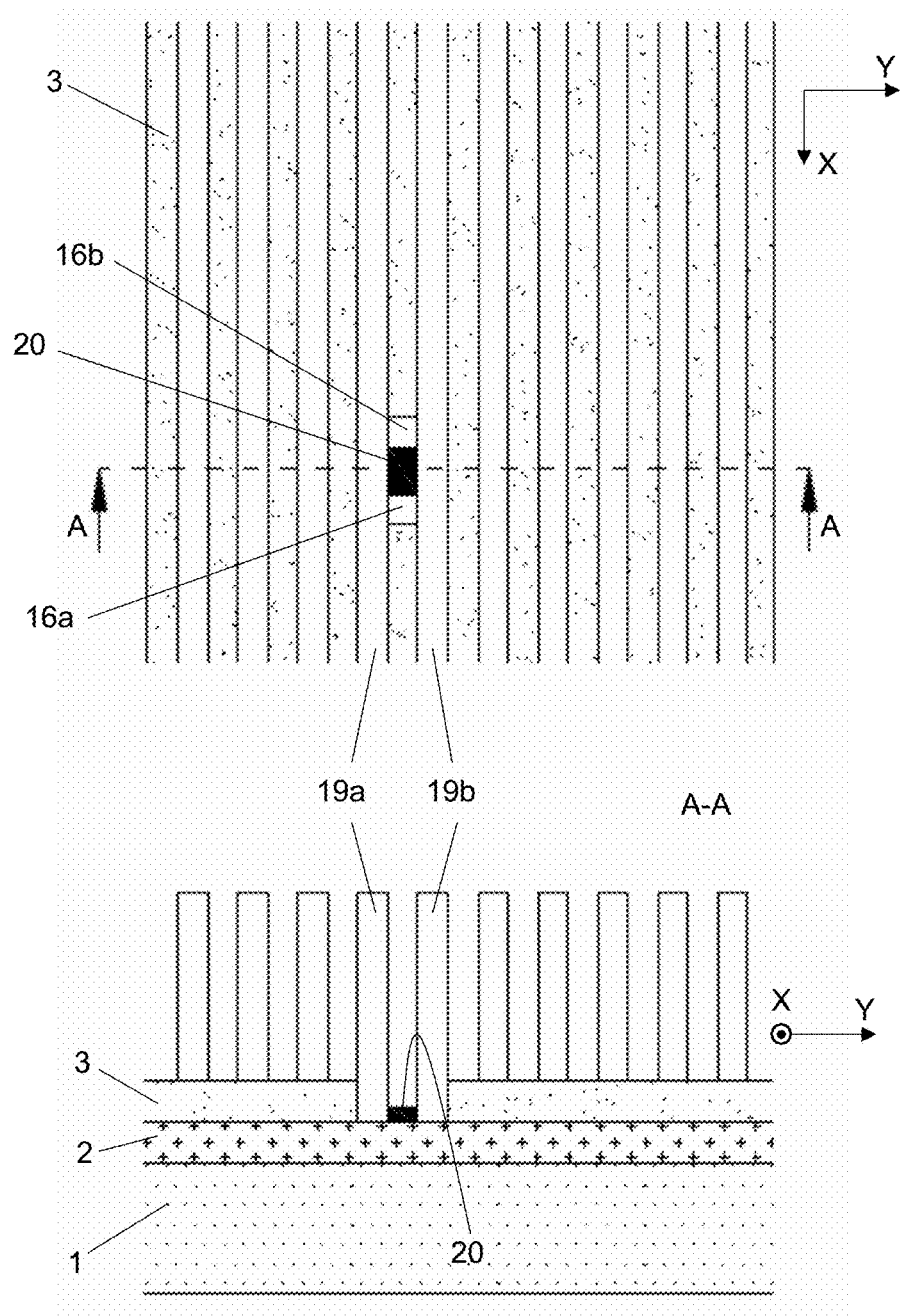

The mandrel lines 4 may then be removed selectively with respect to the spacers 19 and 16a, 16b as shown in FIG. 6. By a process known as area selective deposition (ASD), a layer 20 of ruthenium may be deposited only on the TiN area 15 as shown in FIG. 7. ASD is a process known as such and applied already in similar processes. The parameters used in these known processes can be applied also in this particular step of the method of the disclosure illustrated in FIG. 7. The ruthenium may be used as a blocking material for the subsequent patterning of the TiN hardmask 2. Other materials that may be used instead of Ru may be titanium oxide or platinum. The blocking material may also be applied by methods other than ASD, such as by chemical vapour deposition of a conformal layer, followed by a patterning step.

Figure 8:
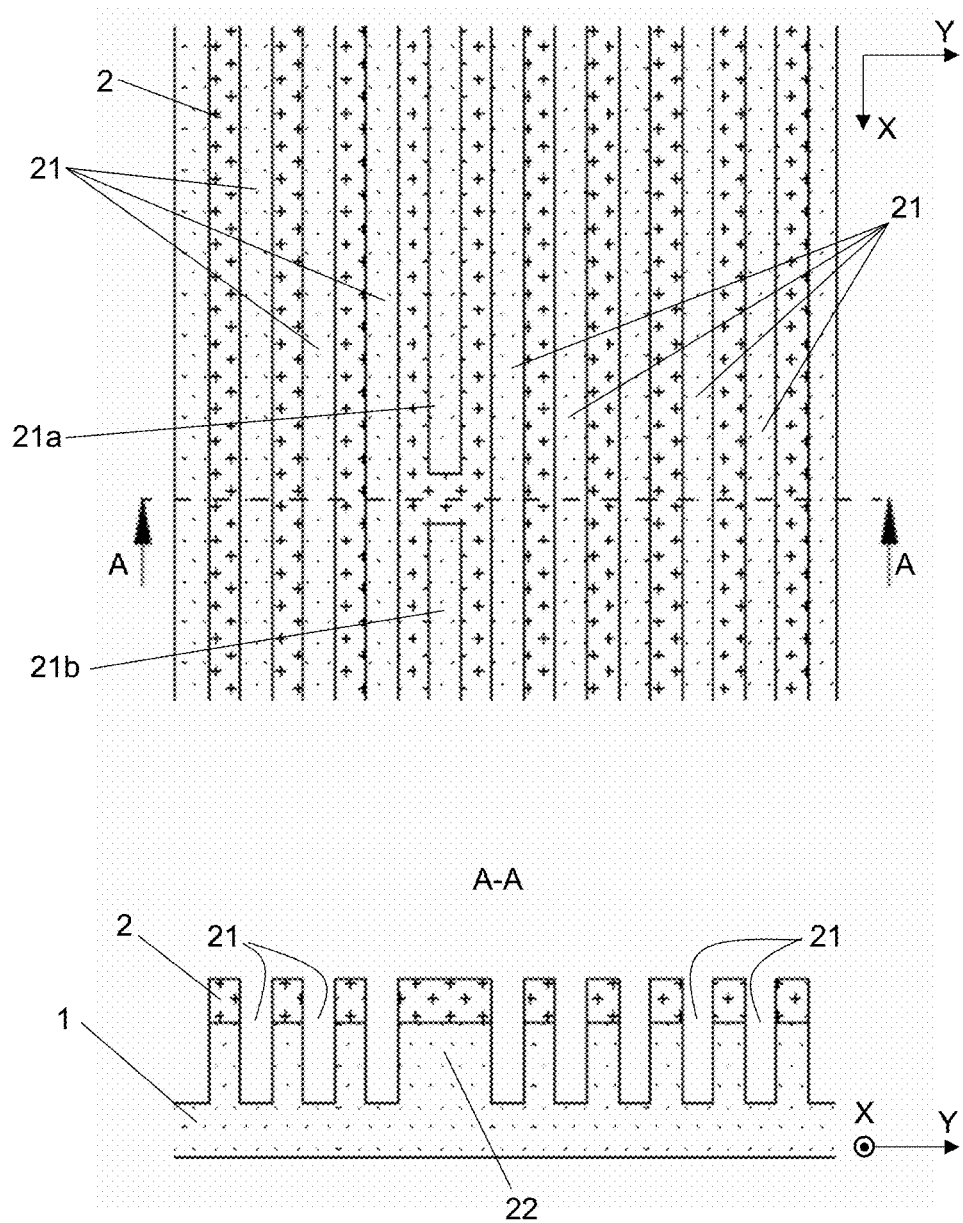

As illustrated in FIG. 8, the etching of the TiN hardmask 2 may take place, using the spacers 19, 16a, 16b and the Ru-block 20 as a mask, followed by stripping the spacer material 19, the Ru block 20, and the SiN layer 3. Then the IMD layer 1 may be etched in accordance with the Ti mask to form trenches 21 in this IMD layer 1. The trenches may be formed everywhere except at the location of the Ru block, where a dielectric gap 22 may be formed between two colinear trenches 21a and 21b.

Figure 9:
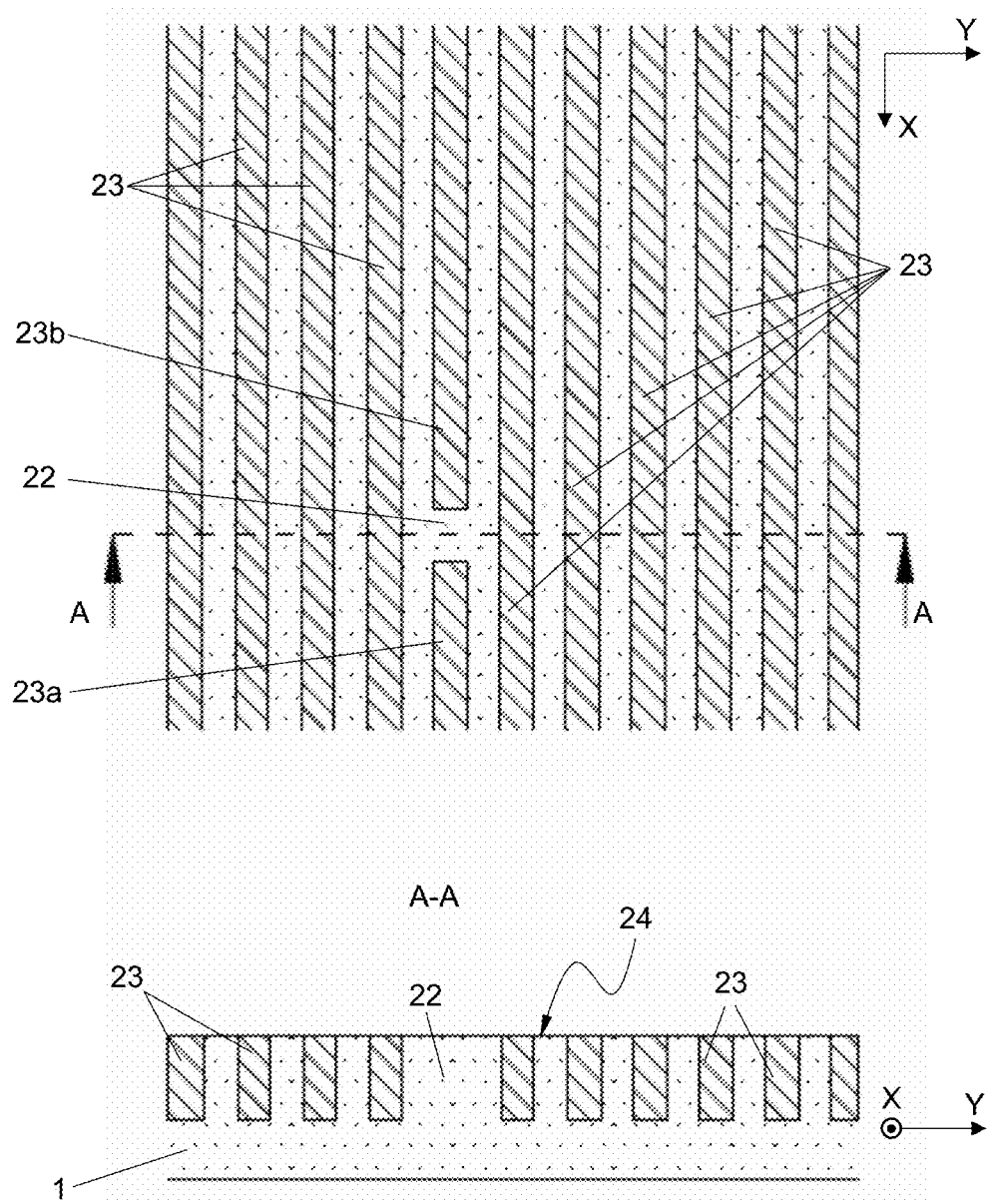

This may be followed by the step of filling the trenches 21 with conductive material, generally metal as shown in FIG. 9, and planarizing the wafer, to form a set of parallel metal lines 23 embedded in the IMD material 1, and having a level upper surface 24, onto which possibly a further IMD layer may be applied. The colinear metal lines 23a and 23b are separated by the dielectric gap 22.

By forming the self-aligned opening 12 before the spacer deposition, the tip-to-tip spacing between the metal lines 23 can be much smaller compared to prior art methods because, as shown in FIGS. 5a and 5b, the spacers 16a and 16b can be formed on the sidewalls of the opening 12, thereby shrinking the area 15 of exposed TiN. The dimensions of this area ultimately determine the dimensions of the Ru block 20 and thus of the tip-to-tip spacing, i.e. the width of the dielectric gap 22. The size D of the opening 12 in the X-direction may be determined by the lithography used for producing the hardmask 10. With current technologies, this width can be reduced to the order of 20 nm. The spacers 16a and 16b may be about 8 nm wide, leaving a width of about 4 nm for the area 15, and thus for the tip-to-tip spacing. In general, tip to tip spacing can therefore be reduced significantly with respect to the best achievable values of about 18 nm of the present state of the art. According to some embodiments, the tip-to-tip spacing may lower than 10 nm, or lower than 5 nm.

Figure 3B:
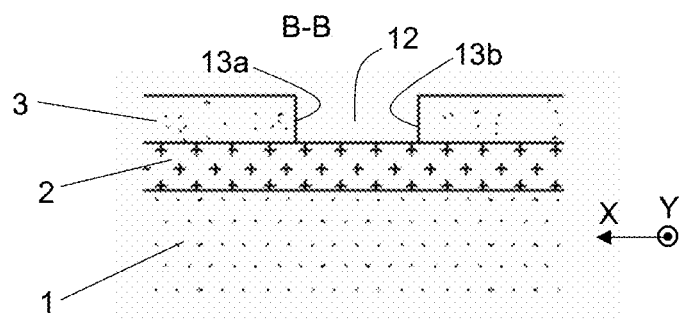
Figure 10A:
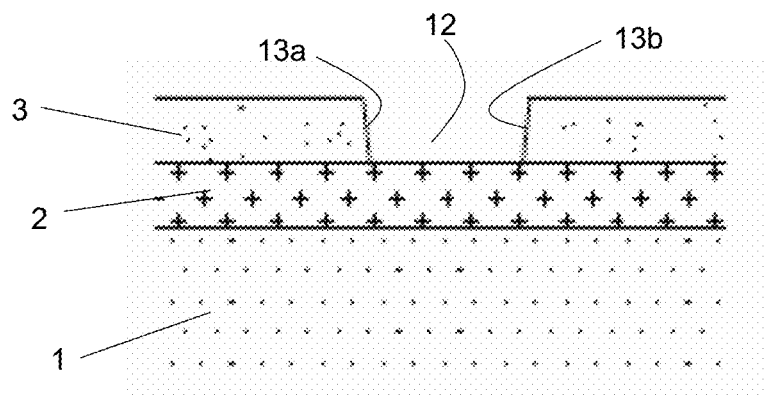
Figure 10B:
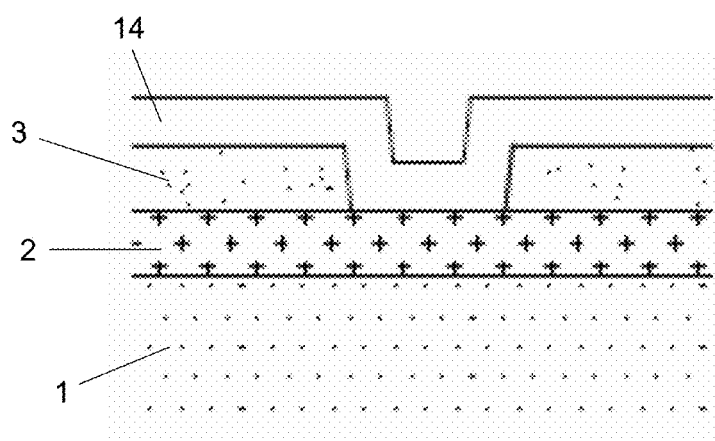
Figure 10C:
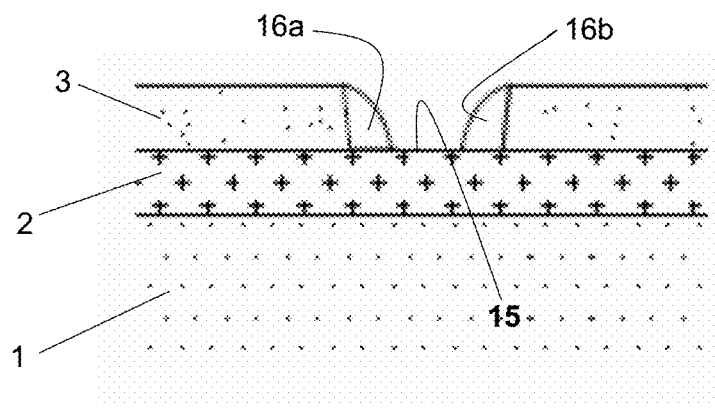

As stated above with reference to FIG. 3b, the sides 13a and 13b of the opening 12 etched in the SiN layer 3 may be slightly slanted inward toward the middle of the opening, as a consequence of an inwardly slanted orientation of the sidewalls of the opening 11 in the mask layer 10. This situation can be illustrated in FIG. 10a. FIGS. 10b and 10c illustrate that the deposition of the spacer material 14 and the spacer etch-back are performed as described above, also in the case of the slanted sides 13a and 13b, and that this slanted orientation further reduces the width of the exposed TiN area 15 in the X-direction. Therefore, as long as the slanted orientation is not too pronounced, this can be actually beneficial in minimizing the tip-to-tip spacing.

The phenomenon of the slanted inner walls may be a consequence of the fact that the etch process which defines the width of the dielectric gap 22 in the X-direction may be a negative tone development process. In many prior art processes, self-aligned block areas may be defined by positive tone development processes, i.e. by creating a pillar instead of an opening at the location of the self-aligned block. The sides of the pillars may be slanted as well, but in this case they may behave in the opposite way to the sides of the opening 12 in FIG. 10a, i.e. the pillar is wider at the bottom then at the top, which may counteract any shrinking of the block dimension.

The array of mandrel lines 4 is just one example of the 'sacrificial structure' referred to in appended claim 1. The disclosure may be applicable to any sacrificial structure comprising two parallel sidewalls onto which spacers are deposited. This occurs for example also in the SALELE technique (self-aligned litho-etch litho-etch), wherein spacers are deposited on the inner walls of elongate openings formed in a sacrificial layer. The method described above can be applied as such on this type of sacrificial structure for producing two colinear conductive lines separated by a dielectric tip-to-tip gap, the lines being defined by the width between two spacers deposited on two mutually facing inner walls of an elongate opening in the sacrificial layer.

While the disclosure has been illustrated and described in detail in the drawings and foregoing description, such illustration and description are to be considered illustrative or exemplary and not restrictive. Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for producing electrically conductive lines on a planar substrate, embedded in a dielectric material, wherein at least two colinear lines are separated by a dielectric gap between tips of said two lines, the method comprising the following steps:
producing a mask layer on a layer of the dielectric material formed on the planar substrate;
producing an intermediate layer on top of and in contact with the mask layer;
producing a sacrificial structure on the intermediate layer, the sacrificial structure comprising at least two parallel and mutually facing sidewalls of the structure with an elongate open area between said sidewalls, the open area extending in an X-direction of an orthogonal X-Y axis system in a plane parallel to the substrate;
by a lithography and etch process, producing an essentially rectangular opening in the intermediate layer, thereby locally exposing the mask layer, wherein
the size of the opening in an Y-direction is self-aligned relative to the two parallel sidewalls, and
the size (D) of the opening in an X-direction is defined by a mask pattern applied in the lithography and etch process;
depositing a layer of spacer material conformally on the sacrificial structure and on a bottom and sidewalls of the opening;
etching back the spacer material so as to expose a top of the sacrificial structure, thereby creating:
two high spacers extending in the X-direction on the two parallel sidewalls, and
two low spacers extending in the Y-direction on the two sidewalls of the opening extending in said Y-direction, wherein the mask layer is exposed in an area of the bottom of the opening, said area being surrounded by the two low spacers and by the two high spacers;
removing the sacrificial structure selectively with respect to the spacers;
depositing a blocking material on the exposed area of the mask layer; using the high and low spacers and the blocking material as a mask for patterning the intermediate layer and the mask layer, thereby creating a patterned mask on the layer of the dielectric material;
etching trenches in the layer of the dielectric material, in accordance with the patterned mask; and
filling the trenches with an electrically conductive material and planarizing said electrically conductive material, thereby obtaining the two colinear conductive lines separated by the dielectric gap at a location of the blocking material.

2. The method according to claim 1, wherein the sacrificial structure is an array of mutually parallel mandrel lines, and wherein the two parallel sidewalls of the sacrificial structure are the mutually facing sidewalls of two adjacent mandrel lines.

3. The method according to claim 1, wherein the sidewalls of the opening in the intermediate layer, extending in the Y-direction are slanted inward toward the middle of the opening, so that the width in the X-direction of an exposed area of the mask layer is reduced compared to a case wherein said sidewalls of the opening are vertical.

4. The method according to claim 1, wherein the mask layer is a titanium nitride layer and the intermediate layer is a layer of silicon nitride.

5. The method according to claim 1, wherein a width of the dielectric gap in the X-direction is lower than 18 nm.

6. The method according to claim 1, wherein a width of the dielectric gap in the X-direction is lower than 10 nm.

7. The method according to claim 1, wherein a width of the dielectric gap in the X-direction is lower than 5 nm.

8. The method according to claim 1, wherein the blocking material is ruthenium, titanium oxide or platinum.

9. The method according to claim 8, wherein the blocking material is ruthenium.

10. The method according to claim 1, wherein the mask layer is a titanium nitride layer, the intermediate layer is a layer of silicon nitride, and the blocking material is ruthenium.

* * * * *